United States Patent [19]

Oguma et al.

[11] Patent Number: 5,701,443

[45] Date of Patent: Dec. 23, 1997

[54] SYSTEM FOR EVALUATING THE RESULTS OF LOGIC SIMULATION

[75] Inventors: Toshio Oguma, Ebina; Yoshinobu Okazaki; Osamu Tada, both of Hadano; Shigeki Yokotani, Minamiashigara, all of Japan

[73] Assignee: Hitachi, Ltd., Tokyo, Japan

[21] Appl. No.: 640,406

[22] Filed: Apr. 29, 1996

Related U.S. Application Data

[63] Continuation of Ser. No. 279,921, Jul. 25, 1994, abandoned.

[30] Foreign Application Priority Data

Jul. 29, 1993 [JP] Japan .................. 5-188042

[51] Int. Cl.⁶ .................................. G06F 17/50
[52] U.S. Cl. .............................. 395/500; 364/578
[58] Field of Search ..................... 364/489, 488, 364/490, 578; 395/500

[56] References Cited

U.S. PATENT DOCUMENTS

| | | | |
|---|---|---|---|
| 4,725,975 | 2/1988 | Sasalu | 364/491 |
| 4,782,440 | 11/1988 | Nomizu et al. | 364/578 |
| 4,878,179 | 10/1989 | Larsen et al. | 364/580 |
| 5,111,413 | 5/1992 | Lazansky et al. | 364/578 |
| 5,210,700 | 5/1993 | Tom | 364/488 |
| 5,220,512 | 6/1993 | Watkins et al. | 364/489 |
| 5,278,769 | 1/1994 | Bair et al. | 364/490 |
| 5,345,401 | 9/1994 | Tani | 364/578 |
| 5,349,539 | 9/1994 | Moriyasu | 364/578 |
| 5,353,289 | 10/1994 | Ohkawa | 371/23 |
| 5,410,673 | 4/1995 | Oguri | 395/500 |
| 5,471,409 | 11/1995 | Tani | 364/578 |
| 5,500,808 | 3/1996 | Wang | 364/578 |
| 5,530,654 | 6/1996 | Takahashi | 364/488 |
| 5,541,849 | 7/1996 | Rostoker et al. | 364/489 |
| 5,544,067 | 8/1996 | Rostoker et al. | 364/489 |
| 5,544,068 | 8/1996 | Takimoto et al. | 364/489 |
| 5,553,002 | 9/1996 | Dangelo et al. | 364/489 |
| 5,553,008 | 9/1996 | Huang et al. | 364/578 |

FOREIGN PATENT DOCUMENTS

| | | |
|---|---|---|
| 03-198159 | 8/1991 | Japan . |
| 04-153776 | 5/1992 | Japan . |

*Primary Examiner*—Krisna Lim
*Assistant Examiner*—Zarni Maung
*Attorney, Agent, or Firm*—Fay Sharpe Beall Fagan Minnich & McKee

[57] ABSTRACT

A logic simulation system for simulating a quality of logic description of a tested electric circuit includes a storage for storing execution results of logic simulation which was conducted for the electric circuit in the past and for which operations of the circuit have been confirmed, logic description to be tested for the electric circuit, and test data of the logic description to be tested. Logic simulation is conducted according to the test data and the logic description to be tested. Results of the logic simulation are compared with the past logic simulation results of operation by correcting time values according to a predetermined rule so as to simulate quality of the logic description, thereby outputting quality of the logic description in a visible form.

19 Claims, 5 Drawing Sheets

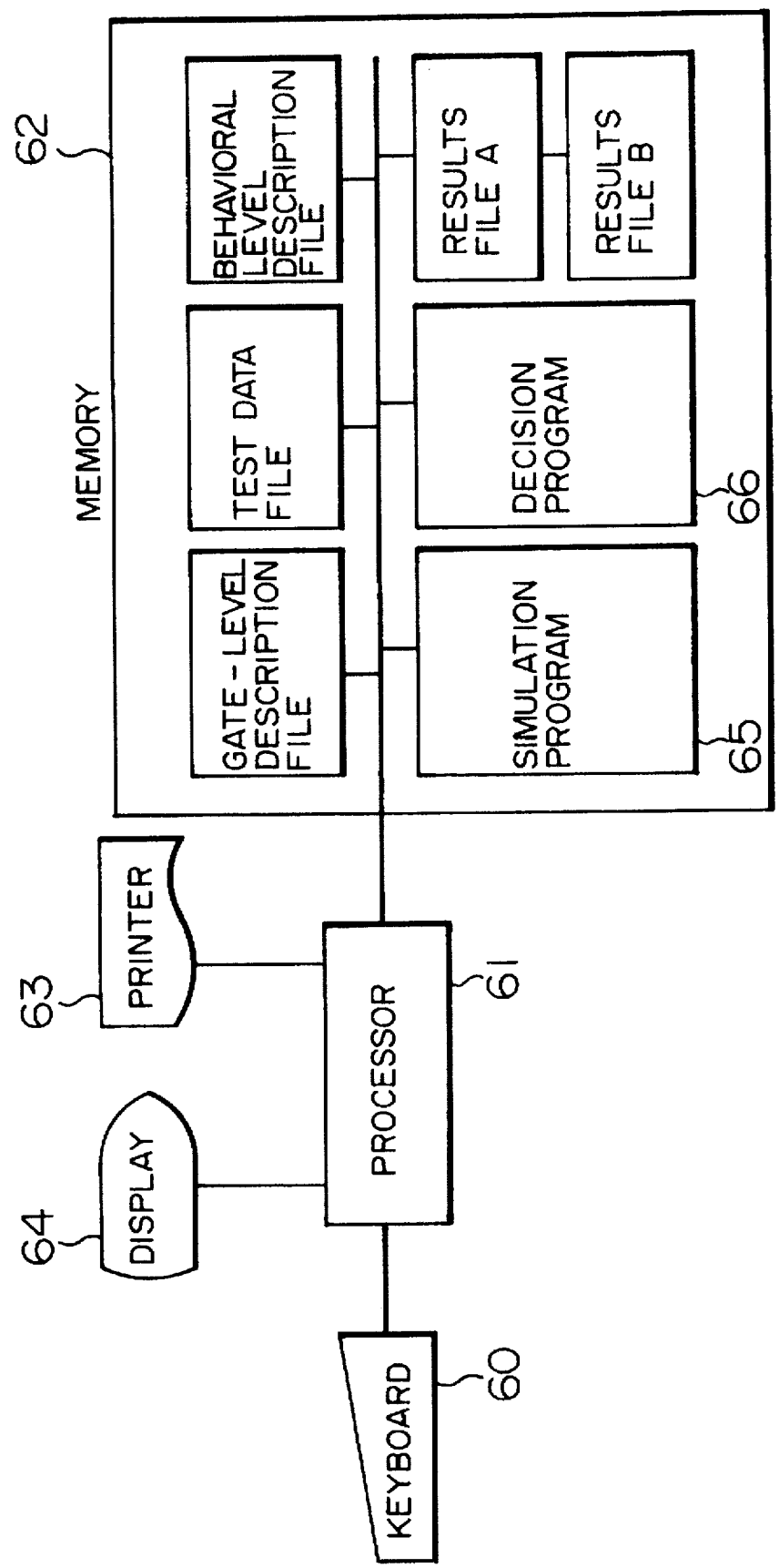

SYSTEM FOR EVALUATING THE RESULTS OF LOGIC SIMULATION

This is a continuation of application Ser. No. 08/279,921, filed Jul. 25, 1994, now abandoned.

BACKGROUND OF THE INVENTION

The present invention relates to a logic simulation system for use in a design stage of an electronic circuit for determining whether or not a logic description of an electronic circuit is acceptable.

The present invention particularly relates to a logic simulation system for use in a logic simulation test for confirming operation of an electronic circuit after changing the logic description as well as in a logic simulation test of an electronic circuit to be executed after a logic description of the circuit described in a high abstraction level into a circuit description in a low abstraction level for efficiently confirming operation of the electronic circuit described in the logic associated therewith.

Conventionally, in a logic simulation to confirm operation of an electronic circuit in a design state, the operation of the circuit is reproduced in a computer according to a logic file in which a logic description of the circuit is beforehand stored such that results of the reproduced operation are outputted as simulation results data. Whether or not the electronic circuit operates according to an intention of the designer (namely, whether or not any error exists in the logic description for the circuit design) is confirmed by humans based on the simulation results, for example, a signal timing chart.

In the logic simulation test, in a case where the logic does not reflect the intention of the designer or an error is detected in the logic or in a case where although the logic simulation test of the circuit is completed without failure, a fault is found in adjustment or the like of the produced electronic circuit, the designer modifies the logic description thereof to be stored in the logic file. After the logic modification, to confirm that the failure is removed by the modification, there is conducted again the logic simulation test. Moreover, the logic simulation test is also achieved for other functions already confirmed before to confirm that these functions are not adversely influenced by the logic modification. Also in this case, the simulation results are confirmed by users.

In addition, since electronic circuits have been increased in size and performance, it is necessary for the logic simulation test confirming operation thereof to include a logic simulation test according to a behavioral-level (or function-level) description having a higher abstraction degree and a logic simulation test according to a gate-level description having a lower abstraction degree.

To test gate-level logic description, the logic description at the behavioral (function) level is converted into a gate-level description to achieve a logic simulation test at the gate level. The logic simulation test at the gate level is executed as described above and results of execution are confirmed also by users.

The above method of confirming the logic simulation results by human power is attended with drawbacks that the load imposed on the designer is increased and there exists a chance of missing a logic fault.

In the JP-A-3-198159, there has been described a technology to automate the confirmation of operation. According to the publication, results of a logic simulation test at a behavioral level are compared with those of a logic simulation test at a gate level so as to determine acceptability of the gate-level logic simulation.

However, according to the conventional technology described above, since the results from the respective tests are simply compared with each other to judge acceptability of the gate-level logic simulation, operation cannot be sufficiently confirmed. That is, in the logic simulation at the gate level, the simulation results are required to be judged for acceptability in consideration of gate delay time, which is not taken into consideration in the above technology.

Particularly, in a logic simulation test to be effected after modification of a logic description item, there occur various cases, for example, a case where a change of an output signal is partially delayed due to shift or deviation of the modified location and a case where a change point of the output signal is generally shifted depending on the modified portion. Such cases cannot be consequently coped with by the simple comparison. Moreover, in a case where a portion of logic is altered, it is necessary to achieve the logic simulation test for the other functions already confirmed so as to confirm that operations thereof are not adversely affected by the logic modification. The prior art cannot efficiently cope with the various test modes.

SUMMARY OF THE INVENTION

It is therefore an object of the present invention to provide a logic simulation system and a logic simulation method capable of reducing the number of confirmation steps to confirm results of a logic simulation executed when a logic is modified or when a logic description at a high abstraction degree is converted into a logic description at a low abstraction degree.

In order to achieve the above object, according to the present invention, there is provided a logic simulation system for judging acceptability of logic description related to an electronic circuit to be tested. The system includes first storage means for keeping therein execution results of logic simulation which was conducted for the electronic circuit in the past and for which correct operations of the circuit have been confirmed and the contents of logic description to be tested for the electronic circuit, input means for inputting therefrom test data of the logic description to be tested, execution means for executing logic simulation according to the contents of logic description and the test data, indication means for indicating a method of comparing results of the logic simulation executed by the execution means with the past logic simulation results of correct operation, and judge means for comparing according to the indicated comparing method the results of the logic simulation with the past logic simulation results of correct operation and thereby judging acceptability of the logic description to be tested.

Moreover, according to the present invention, there is provided a logic simulation system for judging acceptability of logic description related to an electronic circuit to be tested. The system includes first storage means for keeping therein execution results of logic simulation which was conducted for the electronic circuit in the past and for which correct operations of the circuit have been confirmed, second storage means for keeping therein the contents of logic description to be tested for the electronic circuit, input means for inputting therefrom test data of the logic description to be tested, execution means for executing logic simulation according to the logic description to be tested and the test data, and judge means for comparing through a predetermined correction of time values the results of the logic simulation with the past logic simulation results of correct operation and thereby determining quality (or acceptability) of the logic description to be tested.

As above, results of logic simulation effected in the past are used for logic simulation to be accomplished after modification of logic so that resultant data is compared with the previously obtained data to decide acceptability of logic description. In consequence, there is provided a logic simulation system capable of effectively coping with various logic simulations.

Furthermore, when there is beforehand prepared an allowable range for comparison of output values with results of preceding simulations, determination of acceptability of logic description can be automatically carried out. Consequently, acceptability decision can be effected in an automatic manner in various cases, for example, where the simulation results are compared between different logic description levels and where the comparison is conducted for the results after modification of logic, thereby decreasing the number of steps to decide acceptability after execution of logic simulation.

BRIEF DESCRIPTION OF THE DRAWINGS

These and other objects and advantages of the present invention will become apparent by reference to the following description and accompanying drawings wherein:

FIG. 6 is a schematic diagram showing the constitution of an embodiment according to the present invention.

DESCRIPTION OF THE PREFERRED EMBODIMENTS

Figure 1:
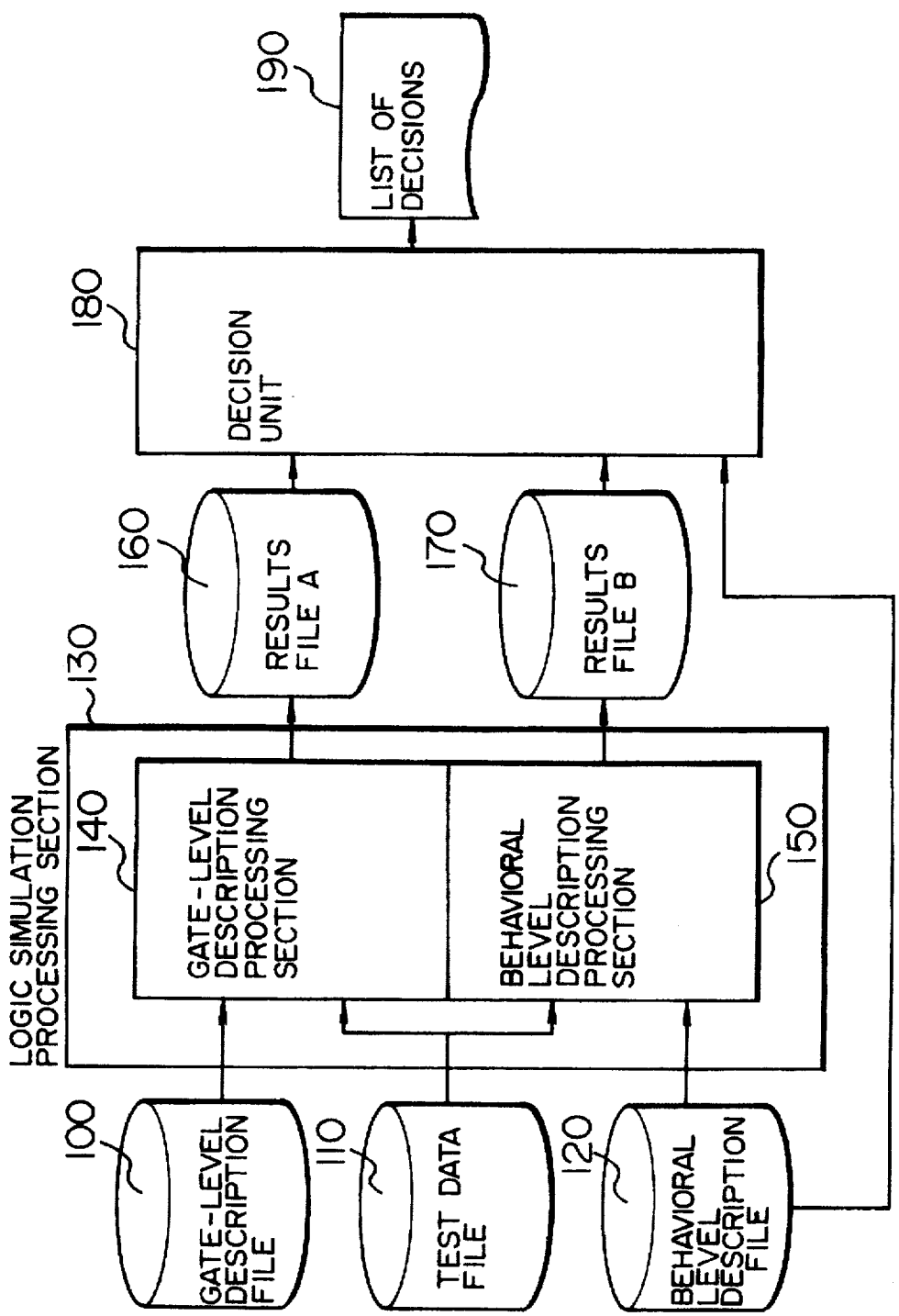
FIG. 1 is a diagram showing the configuration of an embodiment of a logic simulation system to logically verify an electronic circuit according to the present invention.

Referring now to the drawings, description will be given of an embodiment according to the present invention.

In FIG. 1, a reference numeral 100 indicates a gate-level description file for storing therein information such as gate connections, gate delay values, of an electronic circuit to be subjected to a logic simulation test; a numeral 110 denotes a test data file for storing therein input patterns for the logic simulation, and a numeral 120 stands for an behavioral-level description file for storing therein description of behavioral-level operations equivalent to the electronic circuit which is to undergo the simulation.

In other words, the gate-level description file 100 contains a description of logic of a lower abstraction degree of the circuit to be tested, whereas the behavioral-level description file 120 contains a description of logic of a higher abstraction degree of the circuit.

Moreover, in a case where a failure has occurred as a result of a preceding simulation, the gate-level description file 100 is also used to store therein results of logic modification conducted to cope with the failure.

A numeral 130 designates a logic simulation processing section to receive the contents of the gate-level description file 100 and the test data file 110 so as to produce simulation results.

Although test data is read from the test data file 110 to accomplish the logic simulation, there may be employed input means such as a keyboard to input test data therefrom to thereby conduct the simulation.

The processing section 130 includes a gate-level description processing section 140 and an behavioral-level description processing section 150.

A numeral 160 stands for a results file A for storing therein results representing internal states obtained from the simulation achieved according to the contents of the gate-level description and test data files 100 and 110, whereas a numeral 170 indicates a results file B for storing therein results of processing executed by the behavioral-level description processing section 150 according to the contents of the behavioral-level description file 120.

A numeral 180 denotes a decision unit to receive the contents of the results files A 160 and B 170 to for determinating operation of the simulated electronic circuit so as to output a list of determination results by a printer 190. For the printer 190, there may be used any type of printer which can produce a visible output of judge results. It is also possible to employ a display in place thereof to present thereon the judge results.

FIG. 6 shows the system configuration of the embodiment of FIG. 1 in form actually applicable to the simulation of an electronic circuit. The logic simulation system of the embodiment includes a memory 62 for keeping therein the gate-level description file 100, the test data file 110, the behavioral-level description file 120, and the results files A 160 and B 170; a keyboard 60, a printer 63 and a display 64 for presenting judge results. In the memory 62, there are also kept a simulation test program 65 to execute the simulation test and a judge or decision program 66 to achieve the judge processing. The keyboard 60, the memory 62, the display 63 and the printer 64 are controlled by a processing section or processor 61. The processor 61 reads the programs 65 and 66 from the memory 62 to carry out the logic simulation and the determination processing.

Figure 2:
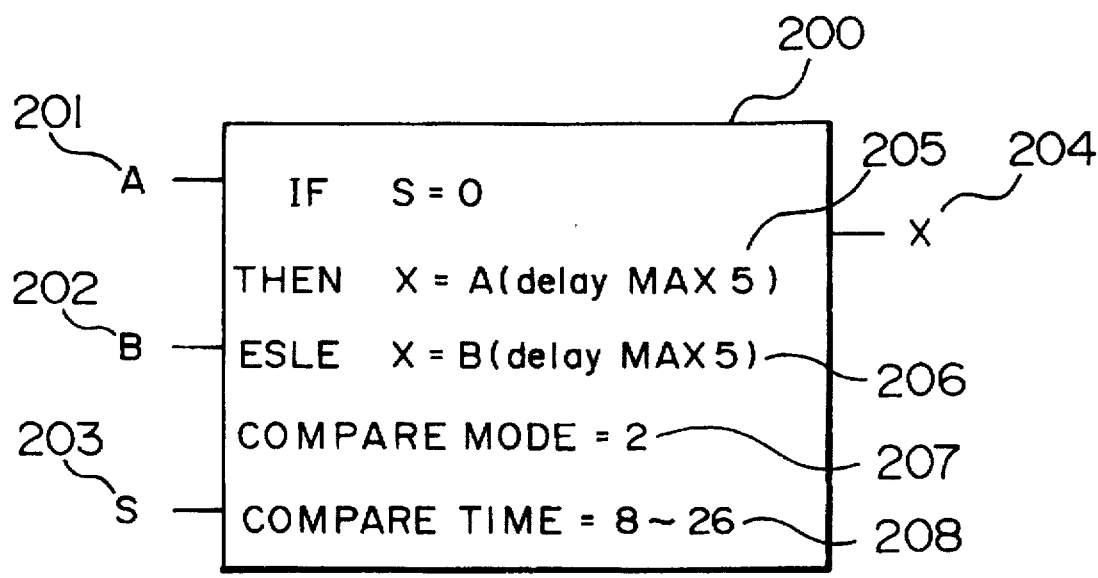
FIG. 2 is a schematic diagram for explaining a behavioral-level description file shown in FIG. 1.

FIG. 2 shows the contents of the behavioral-level description file (also called operation-level description file) 120. To determine whether or not results of simulation conform to the intention of the designer, there are described an allowable range in lines A 205 and B 206 related to a period of time from a change in input signals in lines A 201, B 202, and S 203 to a change in an output signal in a line X 204, a compare mode 207 indicating a comparing method for output values of simulation results, and a compare time 208 to determine an interval of time to judge acceptability of logic description.

In this example, as the allowable range in the lines A 205 and B 206, there are set a maximum time discrepancy of 5 nanoseconds (ns; delay MAX 5) and a minimum time discrepancy of 0 ns (delay MIN 0). The maximum value "5" in the line A 205 representing the allowable range of time means that it is judged to be acceptable if the output value of a signal line X changes within 5 ns after a change in the value of a signal line A.

Furthermore, the judge time for acceptability is set to 8 ns to 26 ns (COMPARE TIME=8–26) and judge means is set by the compare mode 207 (for example, COMPARE MODE=2), which indicates that the signal values and the difference between the change time values of the pertinent signal are checked for decision. The compare mode will be described in detail later.

Figure 3:
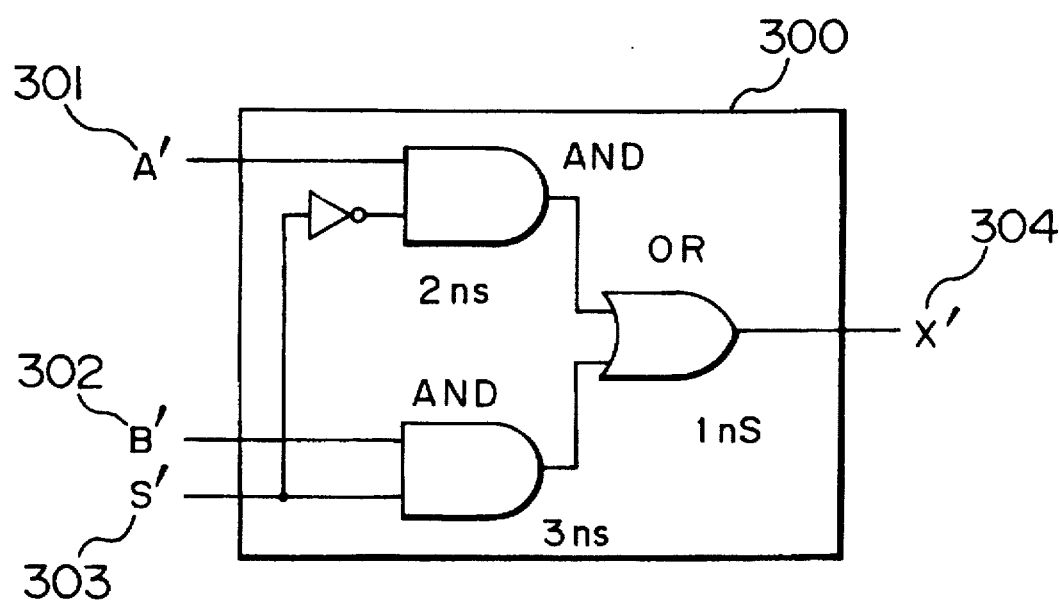
FIG. 3 is a diagram for explaining a gate-level description file shown in FIG. 1.

FIG. 3 shows an example in which an electronic circuit described at the gate level is stored as an object of simulation in the gate description file 100. This example is a circuit diagram of a large scale integration (LSI) circuit having a selector logic circuit equivalent to the electronic circuit stored in the operation-level description file 120. Information of gate connections and gate delay values of the LSI circuit (to be referred to as an electronic circuit 300 herebelow) are stored in the gate description file 100.

In FIG. 3, input signals A' 301, B' 302, and S' 303 and an output signal X' 304 are respectively associated with the input signals A 201, B 202, and S 203 contained in the operation-level description file 120 of FIG. 2 and the output signal X 204 after the change.

In this regard, in the test data file 110, there are stored input patterns to be supplied to the electronic circuit 300 presented in the gate description for logic simulation and to the operation-level description file 120 in which operation of the circuit 300 is described. The test data file is generated for each test item.

The contents of the test file is, for example, as follows.

```
TEST A    sig.A   IH(10)   IL(5)   IH(1)
          sig.B   IH(13)   IL(3)   IH(1)
```

In a test A of this example, a signal A is set to a high level when 10 ns elapse after the test is started. 5 ns thereafter, the signal A is set to a low level and then to a high level again when 1 ns elapses thereafter.

Furthermore, the results file B 170 contains results obtained through processing of the operation-level description file 120 by the operation-level processing section (also called behavioral level description processing section) 150. Assume that the results of operation have already been confirmed to match expected values.

Moreover, assume that the value of the output signal resulted according to the operation-level description is computed with the difference of change time values set to a minimum value.

Figure 4:
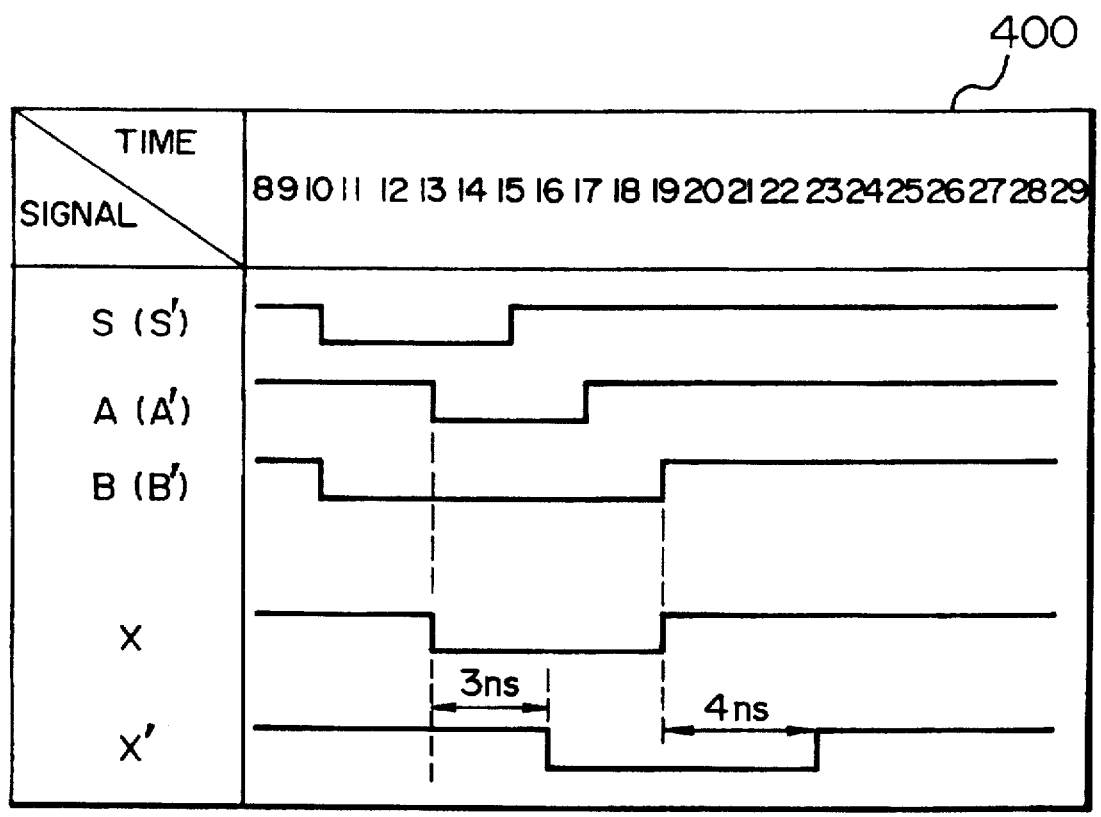
FIG. 4 is a signal timing chart for explaining comparison between simulation results according to the embodiment.

FIG. 4 is a signal timing chart 400 showing relationships between the input signals A 201 (A' 201'), B 202 (B' 202'), and S 203 (S' 203') and the output signal X 204 (X' 204').

In FIG. 4, the output signals X 204 and X' 204' are compare objective signals. In the logic simulation, since "8 ns–26 ns" is described for the acceptability judge time (compare time range: COMPARE TIME) 08, there is obtained the difference between the change time of the value of output signal X 204 and that of the value of output signal X' 204'.

In this case, the change time difference is 3 ns for the first change and 4 ns for the second change; moreover, each of the values are within the allowable range MAX 5 (205). Consequently, judgement results in "good (acceptable)", which is printed out on a sheet of paper by the printer 190.

Figure 5:
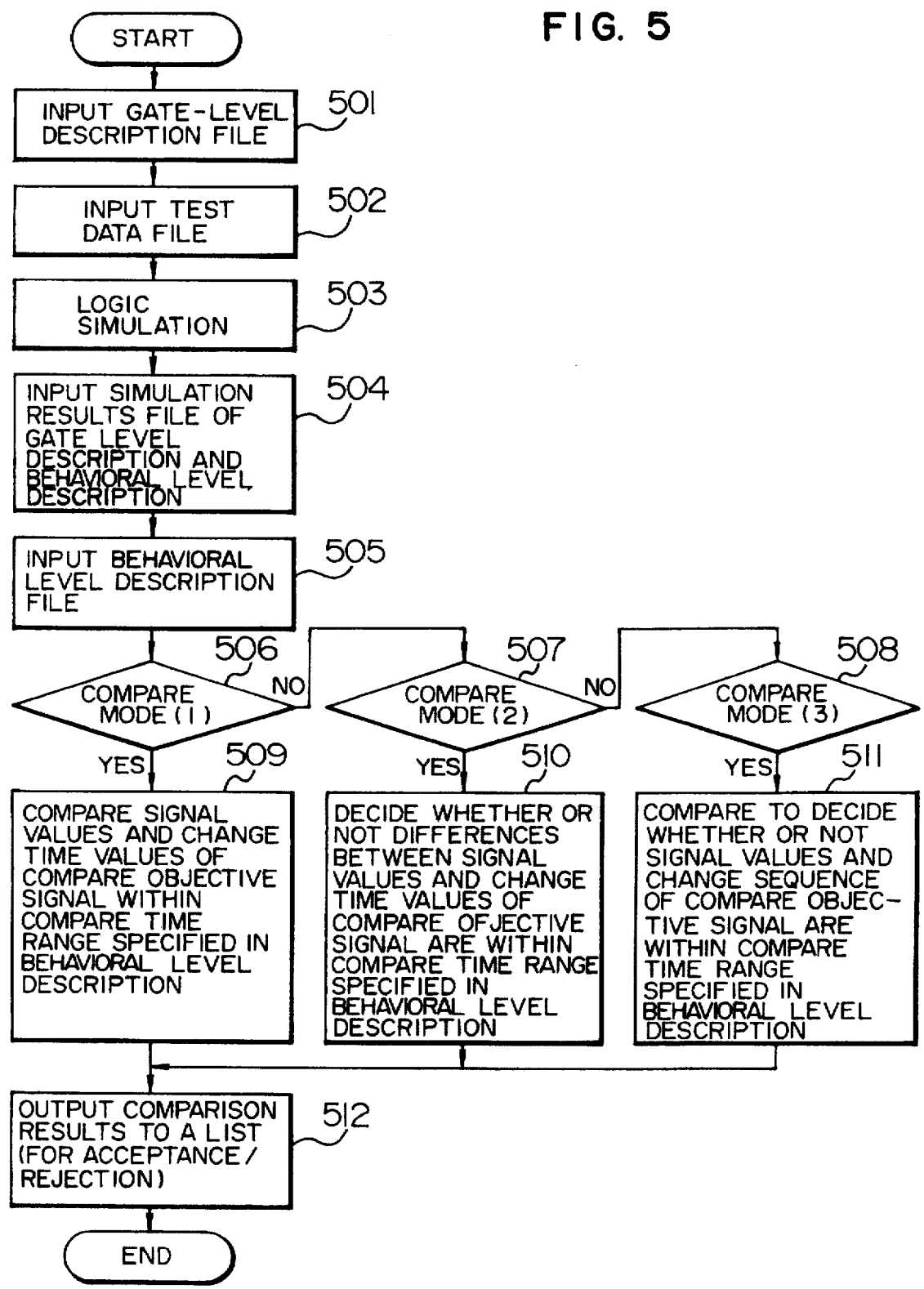
FIG. 5 is a flowchart showing a processing procedure of a logic simulation method according to the embodiment.

FIG. 5 is a flowchart showing a processing procedure of the logic simulation system in the embodiment.

Referring now to the flowchart of FIG. 5, description will be given of the processing flow of the logic simulation method according to the present invention.

First, there are inputted compare objective data, namely, the contents of the gate description file 100 which has undergone a logic modification and those of the test data file 110 to be inputted to the gate description file 100 (steps 501 and 502).

Subsequently, a logic simulation is accomplished using the contents of these files (step 503) to output results of the gate-level logic simulation to the results file A 160.

Next, for comparison of gate-level and operation-level simulation results, the simulation results obtained in the step 503 are read from the results file A 160. Simultaneously, the operation-level simulation results beforehand stored are read from the results file B 160 (step 504).

Thereafter, an access is made to the operation-level description file 120 so as to read therefrom the compare mode 207 necessary for the comparison and information required for the compare mode 207 (step 505).

In a case where the compare mode 207 indicates that the comparison is made for acceptability of signal values and change time values of the compare objective signal, control proceeds to a step 506 for compare mode (1). When the compare mode 207 denotes that the comparison is made to decide whether or not the signal values and the difference between the change time values are respectively within the allowable ranges for the compare objective signal, control is transferred to a step 507 for compare mode (2). Moreover, when the compare mode 207 denotes that the comparison is made to decide whether or not the signal values and the change sequence are respectively acceptable for the compare objective signal, control is passed to a step 508 for compare mode (3).

In addition, the information necessary for the compare mode 207 includes the allowable range item A 205 or B 206 of the change time when "compare mode (2)" is specified for the compare mode 207 as shown in this embodiment.

Incidentally, when specification of the acceptability judge time 208 is present, the specified item is also read from the file 120 when the compare mode 207 is obtained in the step 505.

When the compare mode 207 is "compare mode (1)" (YES in the step 506), control proceeds to a step 509 to conduct comparison for signal values and change time values of the pertinent signal within the compare time range specified in the operation-level description. Results of comparison are outputted as a judge results list 190 (step 512) and the processing is terminated.

When judgement of the compare mode 207 results in "compare mode (2)" (YES in the step 507), control is passed to a step 510 to effect comparison for signal values and differences between change time values of the pertinent signal within the compare time range specified in the operation-level description. Resultant data is outputted as a judge results list 190 (step 512) and the processing is finished.

When the mode 207 is judged to be "compare mode (3)" (YES in the step 508), control is transferred to a step 511 to accomplish comparison for signal values and the change sequence of the pertinent signal within the compare time range specified in the operation-level description. Results of comparison are outputted as a judge results list 190 (step 512) and the processing is terminated.

According to the embodiment, the selection information 207 to determine a method of comparing the simulation results with test results previously obtained through normal operations is stored in the operation description file 120. This is not restrictive, namely, the selection information 207 may be stored in the test file or in independent storage means. Furthermore, the selection information 207 may naturally be supplied from input means such as a keyboard at execution of the logic simulation. This is also the case with the compare time 208 and allowable time values 205 and 206.

However, when the selection information 207 is stored in the independent storage means, it is desirable to establish correspondence between the selection information and test data or preceding test results.

In the embodiment, when acceptability of test results of logic simulation is determined according to test results obtained through normal operations in the past, the data comparison is effected after there is effected data correction with respect to time. In consequence, a flexible judge operation can be automatically conducted in a logical simulation associated with different operation levels.

Moreover, the comparing procedures or methods specified to decide whether or not change time values of the comparison objective data are acceptable, whether or not the difference between change time values of the data is within a predetermined range, and whether or not the change sequence of the data is acceptable are memorized in the past simulation results so as to selectively conduct a test. Consequently, various judge operations can be automatically conducted.

That is, according to the contents of the test, for an electronic circuit undergone logic modification, there can be efficiently conducted judgement for acceptability of mismatching points of change time values, acceptability in association with an allowable time range of mismatching points of change time values, and acceptability of mismatching points of the change sequence.

In addition, since the data items are compared with each other within the specified time range, acceptability of mismatching points can be effectively decided for the electronic circuit undergone logic modification.

Using the logic simulation system of the embodiment, it is possible to minimize the number of steps of confirming the results of logic simulation, which has been conducted by users in the prior art.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

We claim:

1. A logic simulation system for simulating quality of logic description of an electric circuit, comprising:
    first storage means for storing results of a previously performed simulated operation of said electric circuit of which a predetermined operation is confirmed;
    second storage means for storing a logic description of said electric circuit;
    input means for inputting test data for testing said logic description;
    execution means for executing a simulation of operation of said electric circuit in accordance with said test data and said logic description;
    selection means for selecting one of a plurality of comparison operations for comparing results of the logic simulation executed by said execution means with the results of said previous simulated operation stored in said first storage means;
    determination means for determining a quality of said logic description by comparing the results of the logic simulation executed by the execution means with the results of said stored previous simulated operation in accordance with a comparison operation selected by said selection means, said determination means including the plurality of comparison operations, one of which is a full matching of the test data with correct output results and the other taking an allowable time for each signal line into account; and
    third storage means for storing selection information for selecting one of said plurality of comparison operations, wherein said selection means sends said selection information to said determination means.

2. A logic simulation system according to claim 1, further comprising fourth storage means for storing logic description of an electric circuit of which a predetermined operation is confirmed, wherein said selection information is stored in the third storage means with information of a correlation between said selection information and said logic description.

3. A logic simulation system according to claim 1, further comprising fifth storage means for storing said test data, wherein said selection information is stored in said third storage means with information of correlation between said selection information and said test data.

4. A logic simulation system according to claim 1, wherein:
    said comparison operations include a means for determining whether or not a difference between change time values of output values for the test data is within a predetermined allowable time range by using change time values of output values for the test data as a result of logic simulation.

5. A logic simulation system according to claim 4, further including sixth storage means for storing the predetermined allowable time range for each of the test data, wherein the determination means reads the predetermined allowable time range from the sixth storage means to use the range for comparison.

6. A logic simulation system according to claim 1, wherein:
    said comparison operations for comparing includes a means for determining values for the test data are correct by using change time values of output values for the test data as a result of logic simulation.

7. A logic simulation system according to claim 1, further comprising seventh storage means for storing information for specifying a time period in which said determination means executes a comparison, wherein said determination means reads in the compare time from the seventh storage means and executes the comparison on the basis of the period of time specified by the compare time wherein the stored information for specifying the time period is adjustable.

8. A logic simulation system according to claim 1, wherein:
    the results of the executed logic simulation of said electric circuit of which a predetermined operation is confirmed include results of logic simulation for logic description of high abstractions; and
    the logic description to be tested includes logic description of low abstraction.

9. A logic simulation system according to claim 8, wherein:
    the logic description of the high abstractions includes description at an operation level; and
    the logic description of the low abstraction includes description at a gate level.

10. A logic simulation system according to claim 1, further including visible output means for outputting the results of said determination in a visible form.

11. A logic simulation system according to claim 10, wherein the visible output means is a printer.

12. A logic simulation system for simulating quality of logic description of an electric circuit, comprising:
    first storage means for storing results of a previously performed simulated operation of said electric circuit of which a predetermined operation is confirmed;
    second storage means for storing a logic description of said electric circuit;

input means for inputting test data for testing said logic description;

execution means for executing a simulation of operation of said electric circuit in accordance with said test data and said logic description;

third storage means for storing an allowable time range of change time values of output values for the test data;

determination means for conducting a comparison of change time values of output values for the test data between results of the logic simulation effected by the execution means and the past logic simulation results associated with a normal operation, reading in a comparing operation the allowable time range from the third storage means, and determining whether or not a difference between the change time values of the output values is within the allowable time range, thereby determining acceptability of the logic description;

said third storage means previously holding an allowable delay-time at which a change of an output signal occurs for each signal line depending upon a change of an input signal, and said determination means determines whether the logic circuit under test, after being subjected to a logic simulation by referring to said third storage means, is acceptable for said each signal line; and a display means for displaying the result of the determination.

13. A logic simulation system according to claim 12, further including visible output means for outputting the determination results in a visible form.

14. A logic simulation system according to claim 13, wherein the visible output means is a printer.

15. A logic simulation system for simulating quality of logic description of an electronic circuit comprising:

a simulated operation storage means for storing a previously performed simulated operation of said electronic circuit;

a gate-level description file for storing therein information of an electronic circuit to be subjected to a logic simulation test;

a test data file for storing therein input patterns for logic simulation;

a behavioral-level description file for storing therein description of behavioral-level operations equivalent to the electronic circuit which is to undergo the logic simulation test;

a logic simulation processing section to receive the contents of the gate-level description file and the test data file and to execute a simulation of operation of the electronic circuit to produce simulation results, the processing section including, a gate-level description processing section and a behavioral-level description processing section;

a first result file for storing therein results representing internal states obtained from the simulation achieved according to the contents of the gate-level description and test data files;

a second result file for storing therein results of processing executed by the behavioral-level description processing section according to the contents of the behavioral-level description file;

a selection means for selecting one of a plurality of comparison operations for comparing results of the logic simulation executed by the logic simulation processing section with said previous simulated operation stored in said simulated operation storage means;

a decision unit to receive at least one of the contents of the first and second result files for determinating a quality of the simulated electronic circuit by comparing the results of the logic simulation executed by the logic simulation processing section with the stored previous simulated operation in accordance with the comparison operation selected by the selection means; and an output display unit for displaying the output of the decision unit.

16. The logic simulation system according to claim 15, wherein the behavioral-level description file includes an allowable range for signal changes on a first input line and for a second input line, the allowable range related to a period of time from a change in an input signal from at least one of the first and second input lines to a change in an output signal at an output signal line;

a compare mode indicating one of said plurality of comparison operations for outputting values of the simulation results; and a compare time range to determine an interval of time to judge acceptability of a logic description.

17. The logic simulation system according to claim 16, wherein the compare time range is adjustable.

18. The logic simulation system according to claim 15, wherein the allowable range of time is adjustable, and wherein the decision unit outputs an acceptable indication when the output value of the output signal line changes within the adjustable allowable range of time after a change in the value of at least one of the first and second input signal lines.

19. The logic simulation system according to claim 16, wherein standards for evaluation, including the period of time from a change in one of said input signals to a change in said output signal, are correlated to a corresponding one of the first input, second input and output signal lines, thereby enabling individual evaluation of the signal lines.

* * * * *